US011611019B2

(12) United States Patent
Tångring

(10) Patent No.: US 11,611,019 B2
(45) Date of Patent: Mar. 21, 2023

(54) OPTOELECTRONIC COMPONENT HAVING A REFLECTION ELEMENT WITH DIFFUSER PARTICLES AND FILLER PARTICLES EMBEDDED THEREIN

(71) Applicant: Osram OLED GmbH, Regensburg (DE)

(72) Inventor: Ivar Tångring, Regensburg (DE)

(73) Assignee: Osram OLED GmbH, Regensburg (DE)

( * ) Notice: Subject to any disclaimer, the term of this patent is extended or adjusted under 35 U.S.C. 154(b) by 159 days.

(21) Appl. No.: 16/635,563

(22) PCT Filed: Jul. 20, 2018

(86) PCT No.: PCT/EP2018/069759
§ 371 (c)(1),
(2) Date: Jan. 31, 2020

(87) PCT Pub. No.: WO2019/025209
PCT Pub. Date: Feb. 7, 2019

(65) Prior Publication Data
US 2020/0259051 A1     Aug. 13, 2020

(30) Foreign Application Priority Data
Aug. 2, 2017     (DE) ............ 10 2017 117 536.9

(51) Int. Cl.
*H01L 33/60*     (2010.01)
*H01L 33/50*     (2010.01)
(Continued)

(52) U.S. Cl.
CPC .......... *H01L 33/50* (2013.01); *H01L 33/56* (2013.01); *H01L 33/60* (2013.01); *H01L 51/5268* (2013.01); *H01L 2933/0091* (2013.01)

(58) Field of Classification Search
CPC ........ H01L 33/50; H01L 33/60; H01L 33/56; H01L 51/5268; H01L 33/501; H01L 2933/0091; G02B 5/0242
(Continued)

(56) References Cited

U.S. PATENT DOCUMENTS

| 2003/0038596 A1 | 2/2003 | Ho | |
| 2006/0019098 A1* | 1/2006 | Chan | B82Y 30/00 |
| | | | 428/403 |

(Continued)

FOREIGN PATENT DOCUMENTS

| DE | 102008029318 A1 | 2/2009 |
| DE | 102009036622 A1 | 2/2011 |

(Continued)

OTHER PUBLICATIONS

Dr. Rüdiger Paschotta, RP Photonics Encyclopedia.*
(Continued)

*Primary Examiner* — David Chen
(74) *Attorney, Agent, or Firm* — Viering, Jentschura & Partner mbB

(57) ABSTRACT

An optoelectronic component may include a semiconductor chip configured to emit radiation and a reflection element disposed in the beam path of the semiconductor chip where the reflection element is configured to reflect radiation. The reflection element may include a matrix material having diffuser particles and filler particles embedded therein. The diffuser particles are different from the filler particles. The filler particles may include a matrix having scatter particles embedded therein and/or a ceramic comprising the scatter particles in sintered form.

8 Claims, 2 Drawing Sheets

(51) Int. Cl.
*H01L 51/52* (2006.01)
*H01L 33/56* (2010.01)

(58) Field of Classification Search
USPC ............ 257/40, 98, 432, E33.067, E33.072, 257/E33.074
See application file for complete search history.

(56) References Cited

U.S. PATENT DOCUMENTS

| | | | |
|---|---|---|---|
| 2007/0216023 A1* | 9/2007 | Nakatani | B23K 1/0016 257/714 |
| 2009/0050911 A1 | 2/2009 | Chakraborty | |
| 2009/0256166 A1* | 10/2009 | Koike | H01L 33/56 257/98 |
| 2009/0267090 A1* | 10/2009 | Chang | H01L 25/0753 257/E33.056 |
| 2010/0256271 A1* | 10/2010 | Hasegawa | C08F 2/44 524/204 |
| 2012/0229018 A1 | 9/2012 | Lenk et al. | |
| 2014/0091294 A1* | 4/2014 | Chen | H01L 51/524 257/40 |
| 2015/0077966 A1* | 3/2015 | Bessho | F21V 5/002 362/19 |
| 2015/0153639 A1* | 6/2015 | Tokunaga | G02B 5/0278 359/453 |
| 2016/0254417 A1 | 9/2016 | Morimura et al. | |
| 2017/0003547 A1* | 1/2017 | Tochigi | H01L 51/5268 |
| 2017/0018687 A1* | 1/2017 | West | H01L 33/502 |
| 2017/0117444 A1 | 4/2017 | Stoll et al. | |
| 2017/0139088 A1 | 5/2017 | Iki et al. | |

FOREIGN PATENT DOCUMENTS

| | | |
|---|---|---|
| DE | 102014105142 A1 | 10/2015 |
| DE | 102014118449 A1 | 6/2016 |
| EP | 2811001 A1 | 12/2014 |
| WO | 2011092646 A2 | 8/2011 |

OTHER PUBLICATIONS

German search report issued for corresponding DE application No. 10 2017 117 536.9, dated Jun. 30, 2018, 12 pages (for informational purposes only).

International search report issued for corresponding PCT application No. PCT/EP2018/069759, dated Oct. 10, 2018, 15 pages (for informational purposes only).

* cited by examiner

OPTOELECTRONIC COMPONENT HAVING A REFLECTION ELEMENT WITH DIFFUSER PARTICLES AND FILLER PARTICLES EMBEDDED THEREIN

CROSS-REFERENCE TO RELATED APPLICATIONS

The present application is a national stage entry according to 35 U.S.C. § 371 of PCT application No.: PCT/EP2018/069759 filed on Jul. 20, 2018; which claims priority to German Patent Application Serial No.: 10 2017 117 536.9, which was filed on Aug. 2, 2017; which is incorporated herein by reference in its entirety and for all purposes.

TECHNICAL FIELD

The invention relates to an optoelectronic component. The invention further relates to a process for producing an optoelectronic component.

BACKGROUND

It is an object to be achieved to provide an optoelectronic component having high reflection and mechanical and thermal stability. It is a further object to be achieved to provide a process for producing an optoelectronic component that produces a highly reflective, mechanically and thermally stable component in an inexpensive and rapid manner.

SUMMARY

In at least one embodiment, the optoelectronic component has at least one semiconductor chip. The semiconductor chip is configured to emit radiation. The component has a reflection element. The reflection element is disposed in the beam path of the semiconductor chip. The reflection element is intended for reflection of radiation. The reflection element has a matrix material. Diffuser particles and filler particles are embedded in the matrix material. The diffuser particles and the filler particles are different than one another. The filler particles have a matrix into which scatter particles are embedded and/or the filler particles have a ceramic in which the scatter particles are in sintered form.

In at least one embodiment, the optoelectronic component has a semiconductor chip. The semiconductor chip is configured to emit radiation. In particular, the semiconductor chip emits radiation in operation.

In at least one embodiment, the semiconductor chip has a semiconductor layer sequence. The semiconductor layer sequence is based on a III-V compound semiconductor material. "Based on a nitride compound semiconductor material" in the present context means that the semiconductor layer sequence or at least one layer thereof includes a III nitride compound semiconductor material, such as $In_xAl_yGa_{1-x-y}N$ where $0 \leq x \leq 1$, $0 \leq y \leq 1$ and $x+y \leq 1$. This material need not necessarily have a mathematically exact composition according to the above formula. Instead, it may include one or more dopants and additional constituents that essentially do not alter the characteristic physical properties of the $In_xAl_yGa_{1-x-y}N$ material. For the sake of simplicity, however, the above formula includes only the essential constituents of the crystal lattice (In, Al, Ga, N), even though they may be partly replaced by small amounts of further substances.

The optoelectronic component includes an active region having at least one pn junction and/or having one or more quantum well structures. In the operation of the optoelectronic component, electromagnetic radiation is generated in the active region. A wavelength or wavelength maximum of the radiation is in the ultraviolet and/or visible region, especially at wavelengths between 420 nm and 680 nm inclusive, for example between 440 nm and 480 nm inclusive.

In at least one embodiment, the semiconductor chip is a light-emitting diode, LED for short. The component is configured to emit radiation with a dominant wavelength from the UV, blue, green, yellow, orange, red and/or near IR spectral region.

In at least one embodiment, the component has a reflection element. The reflection element is disposed in the beam path of the semiconductor chip. What is meant here is more particularly that the radiation from the semiconductor chip is reflected by the reflection element. The reflection element has a reflectance of not less than 70%, such as not less than 90%, for example 95%. The reflection element is thus intended for reflection of radiation.

In at least one embodiment, the reflection element includes a matrix material. The matrix material may be epoxide, an epoxy molding compound, silicone, hybrid material or a combination thereof. The matrix material is an epoxy molding compound (EMC).

In at least one embodiment, a diffuser particle is embedded in the matrix material. The diffuser particle may have been selected from a group including $Al_2O_3$, $Ta_2O_5$, $ZrO_2$, ZnO, $SiN_x$, $SiO_xN_y$, $SiO_2$, $TiO_2$, $ZrO_2$, $HfO_2$, $Nb_2O_5$, $MgF_2$ or combinations thereof. The diffuser particles are titanium dioxide.

In at least one embodiment, filler particles are embedded in the matrix material. The filler particles differ from the diffuser particles. More particularly, the diffuser particles include or consist of the materials described above, whereas the filler particles, in one embodiment, have a matrix in which scatter particles are embedded and/or, in another embodiment, the filler particles are in the form of a ceramic in which the scatter particles are sintered. "Sintering" here can mean that the scatter particles are heated below their melting temperature.

In at least one embodiment, the diffuser particles have an average particle diameter smaller by a factor of at least 10, 15, 20, 50, 80, 100, 1000 than the average particle diameter of the filler particles. What is meant by average particle diameter here is especially the d50. d50 denotes the diameter of a particle according to its median size by mass. The particle diameter can be determined, for example, by means of dynamic light scattering.

In at least one embodiment, the particle diameter of the diffuser particles has a value between 100 nm and 1000 nm inclusive, especially between 150 nm and 250 nm inclusive, for example 200 nm. Alternatively or additionally, the filler particles have a particle diameter of 10 µm to 50 µm, for example of 20 µm up to and including 30 µm, for example 25 µm. The particle diameters here are especially average particle diameters.

In at least one embodiment, the scatter particles are formed from the same material as the diffuser particles. Alternatively or additionally, the scatter particles are selected from a group including aluminum oxide, tantalum oxide, zirconium oxide, zinc oxide, silicon nitride, silicon oxynitride, silicon oxide, titanium oxide, zirconium oxide, hafnium oxide, niobium oxide, magnesium oxide or combinations thereof. The scatter particles are composed of titanium dioxide and/or silicon dioxide.

Alternatively or additionally, the diffuser particles are dispersed in the matrix material. The scatter particles are embedded in glass as matrix and/or sintered in the form of a ceramic.

In at least one embodiment, the filler particles have glass as matrix, where the glass is a tellurite glass, a silicate glass, an aluminosilicate glass, a borate glass, a borosilicate glass or a phosphate glass.

In at least one embodiment, the proportion of the scatter particles in the filler particles is 45 wt % to a maximum of 70 wt % or 50 wt % to a maximum of 75 wt %, such as 60 wt %-70 wt %, in relation to the matrix or matrix material.

In at least one embodiment, the proportion of the scatter particles in the filler particles corresponds to the proportion of the diffuser particles. In other words, the concentration of the scatter particles is identical to the concentration of the diffuser particles. In a non-limiting embodiment, the material of the scatter particles is additionally the same as the material of the diffuser particles. The concentrations of the diffuser particles and scatter particles may be the same, especially when the concentration is reported here in vol %.

In at least one embodiment, the proportion of the filler particles is between 10 wt % and 30 wt % in the reflection element. For example, the proportion of the filler particles in the reflection element is 20 wt %.

In at least one embodiment, the diffuser particles consist of titanium dioxide. The matrix material is an epoxy molding compound.

The filler particles have a silicate glass as matrix. Titanium dioxide is embedded therein.

The proportion of the diffuser particles in the reflection element is 50 wt %-70 wt % based on the matrix material and the filler particles.

In at least one embodiment, the proportion of $TiO_2$ is 45 wt %-70 wt % in the particles, for example 50 wt %-70 wt %, based on the proportion of matrix material and diffuser particles, for example epoxy+$TiO_2$.

The average particle diameter of the diffuser particles is less than the average particle diameter of the filler particles. The average particle diameter of the diffuser particles is smaller by a factor of 10, 15, 20, 50, 80, 100, 1000 than the average particle diameter of the filler particles. In other words, the filler particles are larger than the diffuser particles.

In at least one embodiment, the filler particles have a particle diameter between 25 μm and 50 μm inclusive, for example 30 μm. The particle diameter here means the average particle diameter that can also be referred to as the d50.

In at least one embodiment, the filler particles are in ceramic form. The filler particles include titanium dioxide in the ceramic. The ceramic is especially white. The ceramic can be produced by a mixture of titanium dioxide or other materials, for example silicon dioxide or magnesium difluoride or pure titanium dioxide. For this purpose, for example, titanium dioxide in powder form can be sintered at high temperatures. But the temperature chosen should not be too high in order that the titanium dioxide particles do not melt; instead, there should especially be partial melting of the titanium dioxide particles, such that the mass sticks together. Subsequently, the ceramic thus generated can be comminuted, such that filler particles that can be embedded in the matrix material can be generated.

Alternatively, it is also possible to use white glass as matrix. It is additionally possible to embed scatter particles, especially titanium dioxide, in this white glass. The embedding can be effected, for example, in that the glass is in the form of a glass melt and then the titanium dioxide is embedded in powder form.

Alternatively, it is possible to mix pulverulent scatter particles and the pulverulent matrix, for example pulverulent titanium dioxide and pulverulent silicon dioxide, and then to heat them above the melting temperature, so as to form a glass matrix in which the scatter particles are dispersed. Subsequently, the reflection element thus generated can be comminuted and embedded, especially dispersed, in the matrix material.

In at least one embodiment, the filler particles include titanium dioxide and silicon dioxide or titanium dioxide and magnesium fluoride as ceramic.

In at least one embodiment, the diffuser particles consist of titanium dioxide. The matrix material is an epoxy molding compound. The filler particles are in ceramic form. The filler particles include titanium dioxide. The proportion of the diffuser particles in the reflection element is 50 wt %-70 wt % based on the matrix material and the filler particles.

The diffuser particles have a particle diameter of 150 nm-200 nm, for example 170 nm. The filler particles have a particle diameter of 15 μm-30 μm, for example 20 to 25 μm.

In at least one embodiment, the diffuser particles consist of titanium dioxide, where the matrix material is an epoxy molding compound, where the filler particles have a silicate glass as matrix and titanium dioxide embedded therein, where the proportion of the titanium dioxide in the filler particles is 45 wt %-70 wt %, where the proportion of the diffuser particles in the reflection element is 45 wt %-70 wt %, where the average particle diameter of the diffuser particles is less than the average particle diameter of the filler particles. The proportion of the titanium dioxide in the filler particles is based especially on the proportion of epoxy molding compound and titanium dioxide.

In at least one embodiment, the diffuser particles consist of titanium dioxide, where the matrix material is an epoxy molding compound, where the filler particles are in ceramic form and include titanium dioxide, where the proportion of the diffuser particles in the reflection element is 50 wt %-70 wt %, where the diffuser particles have a particle diameter of 150 nm to 200 nm, where the filler particles have a particle diameter of 15 μm to 30 μm. The proportion of the titanium dioxide in the filler particles is based especially on the proportion of epoxy molding compound and titanium dioxide. The diffuser particles have, for example, a particle diameter of 170 nm+/−5%, 4%, 3%, 2%, 1% of this value.

In at least one embodiment, the reflection element is configured to insulate a printed circuit board. Alternatively or additionally, the reflection element serves to insulate a carrier. The carrier may include, for example, a printed circuit board.

In at least one embodiment, the reflection element is part of a housing. The semiconductor chip may be disposed in the recess thereof. The housing may especially form direct contact with a carrier, for example the printed circuit board. "Contacting" here means especially direct or indirect mechanical and/or electrical contact.

Leadframes made of epoxy-based materials show low reflectivity. In order to increase its reflectivity, small particles, for example having a particle diameter of 200 nm, may be dispersed into this epoxy molding compound. For example, titanium dioxide is incorporated by dispersion. The scattering results from the refraction at the interface to the epoxy matrix material. The epoxy molding compounds (EMC) have low reflectivity. The EMCs are especially transparent and transmit the light to other absorbers. The concentration of the titanium dioxide particles that are embedded in the matrix material in a proportion of 10 to 30 wt % is comparatively low. It is also possible to incorporate larger particles by dispersion, for example silicon dioxide particles, having a particle diameter of 10 µm to 50 µm as filler particles in order to improve mechanical strength and the low coefficient of thermal expansion (CTE). Typically, large silicon dioxide particles having a proportion of about 50 wt % or more are incorporated by dispersion. If a higher concentration of the diffuser particles, for example titanium dioxide, is added to the epoxy matrix material, the viscosity of the material is increased significantly, and so it is difficult to apply this material to the leadframe, such that the end product is partly mechanically brittle.

There are other materials, for example polycyclohexylene dimethylene terephthalate (PCT), that have a higher reflectivity than the EMC. Therefore, no additional diffuser particles are required in the case of these materials to improve the mechanical stability. However, these materials exhibit a short lifetime since these materials are not very resistant to temperature and UV radiation. Moreover, there are known white silicone molding compounds (SMCs) that improve robustness to radiation and to temperature by comparison with EMCs. But silicones are more expensive and they are less mechanically stable than epoxy and have a significantly higher coefficient of thermal expansion, and so use of silicone in a component leads to higher stress in the overall component.

The inventors have now recognized that, by virtue of the component described here with the reflection element described here, it is possible to provide a reflection element that overcomes the disadvantages described above. The reflection element includes a matrix material, especially composed of EMC, incorporating diffuser particles. These diffuser particles increase or improve the reflectivity of the housing. Moreover, the reflection element includes filler particles including white glass, for example, as matrix. In this glass as matrix, it is additionally possible for titanium dioxide to be generated in a glass melt or by heating of titanium dioxide and silicon dioxide powder mixtures.

Moreover, it is possible that a white ceramic composed of a mixture of titanium dioxide and other materials, for example silicon dioxide or magnesium difluoride, or pure titanium dioxide is processed as ceramic. This can increase reflectivity compared to a material including titanium dioxide in a matrix material such as silicone or a glass matrix. Such filler particles may be incorporated into the matrix material, such as EMC, as known to date for silicon dioxide particles. The process can be effected analogously to the production of a reflection element including matrix material and silicon dioxide particles.

In at least one embodiment, the diffuser particles and/or filler particles are distributed homogeneously in the matrix material. Alternatively, the diffuser particles and/or filler particles are distributed by means of a concentration coefficient in the matrix material.

In at least one embodiment, the scatter particles are distributed homogeneously or with a concentration gradient in the matrix of the filler particles.

The inventors have recognized that, in the form of the component described here, it is possible to provide a component having enhanced efficiency compared to components that have, for example, EMC carriers, especially EMC leadframes, without filler particles and diffuser particles. In addition, the component described here can easily be integrated into existing processes. It is thus possible to save material costs and time. Moreover, it is possible to use a matrix material, for example EMC, that can be provided inexpensively (compared to silicone-based molding compounds).

In at least one embodiment, the matrix has been formed from glass. The glass matrix may be oxidic and includes or consists of at least one of the following materials: lead oxide, bismuth oxide, boron oxide, silicon dioxide, phosphorus pentoxide, aluminum oxide, tellurium dioxide or zinc oxide. In a non-limiting embodiment, the glass matrix includes zinc oxide. The glass matrix is free of lead oxide. The materials described here may be present individually or in combination with the glass matrix.

In at least one embodiment, the glass matrix includes or consists of zinc oxide, boron trioxide and silicon dioxide.

In at least one embodiment, the glass matrix includes zinc oxide, at least one glass former or a network modifier or an intermediate oxide. The glass former may, for example, be boric acid, silicon dioxide, phosphorus pentoxide, germanium dioxide, bismuth oxide, lead oxide and/or tellurium dioxide. The network modifier or the intermediate oxide may be selected from the following group or combinations thereof: alkaline earth metal oxide, alkali metal oxide, aluminum oxide, zirconium oxide, niobium oxide, tantalum oxide, tellurium dioxide, tungsten oxide, molybdenum oxide, antimony oxide, silver oxide, tin oxide, rare earth oxides.

In at least one embodiment, the glass matrix is a tellurite glass.

In at least one embodiment, the glass matrix has a proportion of at least 50%, 60%, 70% or 80%, such as 70%, of scatter particles in the filler particles. The percentages here are in wt %.

A non-limiting embodiment further relates to a process for producing an optoelectronic component. The process described here produces the optoelectronic component described here. All definitions and details of the component are also applicable to the process and vice versa.

In at least one embodiment, the process for producing an optoelectronic component has the following process steps, especially in the sequence specified:

A) providing a semiconductor chip configured to emit radiation,

B) producing a reflection element and then disposing the reflection element in the beam path of the semiconductor chip, wherein the reflection element is produced as follows:

B1) providing a matrix material,

B2) embedding diffuser particles and filler particles into the matrix material, wherein the diffuser particles and the filler particles are different than one another, wherein the filler particles composed of a glass melt as matrix into which scatter particles have been embedded are generated by heating scatter particles in glass and/or from a ceramic.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1A:
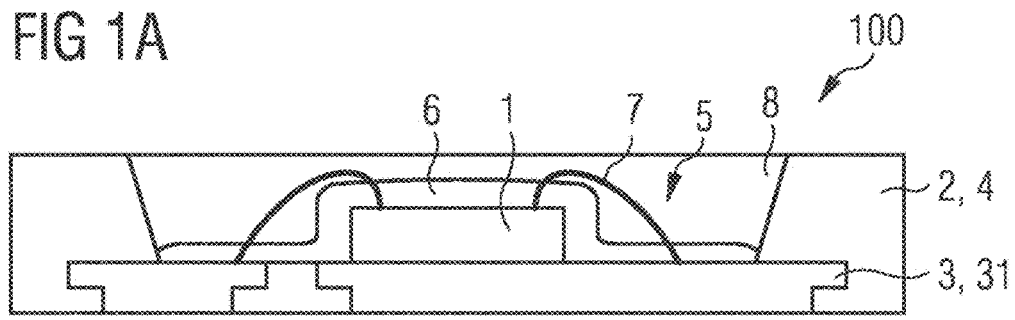
FIG. 1A: a schematic side view of an optoelectronic component in one embodiment.

FIG. 1A shows a schematic side view of an optoelectronic component in one embodiment.

The optoelectronic component 100 has a carrier 3. More particularly, the carrier is a leadframe 31. The leadframe is especially formed from copper. The component has a housing 4. The reflection element 2 is part of the housing 4. The housing has a recess 5. In the recess 5, the semiconductor chip 1 is disposed on the printed circuit board 31. In addition, the component 100 has a conversion layer 6. The conversion layer covers both the main radiation area of the semiconductor chip 1 and its lateral faces, and additionally the surfaces of the printed circuit board. The lateral faces may be completely or only partly covered. "Partly covered" may especially mean that at least 50% of the lateral faces is covered. Surfaces of the printed circuit board are completely covered. The recess 5 may additionally have been encapsulated with a silicone potting compound. The conversion element 6 may conventionally include conversion materials such as orthosilicates, garnets, silicates, nitrides.

The semiconductor chip 1 here is configured to emit radiation, for example from the blue spectral region. The blue light emitted can be converted by means of the conversion element 6 to radiation with an altered wavelength, for example with a red wavelength or green wavelength. It is then possible for red or green radiation to exit from the component 100 in the case of full conversion, or white mixed light in the case of partial conversion. The semiconductor chip 1 has been contacted by means of electrical contacting 7.

Figure 1B:
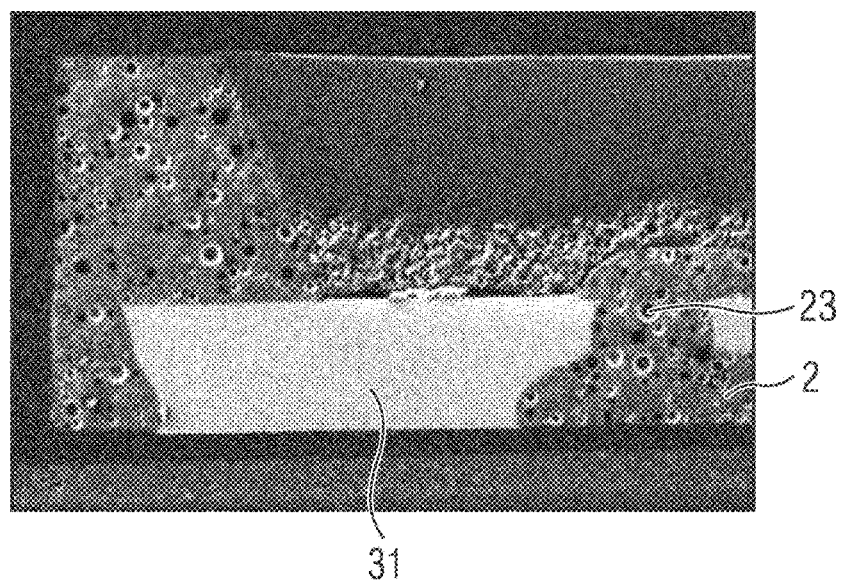
FIG. 1B: an electron microscope image in one embodiment.

The reflection element 2 is disposed in the beam path of the semiconductor chip. The reflection element 2 is intended to reflect radiation. The reflection element 2 has a matrix material 21. Diffuser particles 22 and filler particles 23 are embedded in the matrix material 21 (not shown here). The filler particles 23 and diffuser particles 22 differ from one another. The filler particles 23 have a matrix 231 into which scatter particles 232 are embedded and/or a ceramic 231 in which the scatter particles 232 are in sintered form FIG. 1B shows an electron microscope image (SEM) of a lateral cross section of an optoelectronic component 100 according to a comparative example. The large particles, i.e. the filler particles 23, can easily be seen here. The smaller particles, i.e. especially the diffuser particles 22, for example of titanium dioxide, can barely be seen owing to their smaller particle size. The larger particles, for example silicon dioxide fillers, have a particle diameter between 25 μm and 50 μm.

Figure 1C:
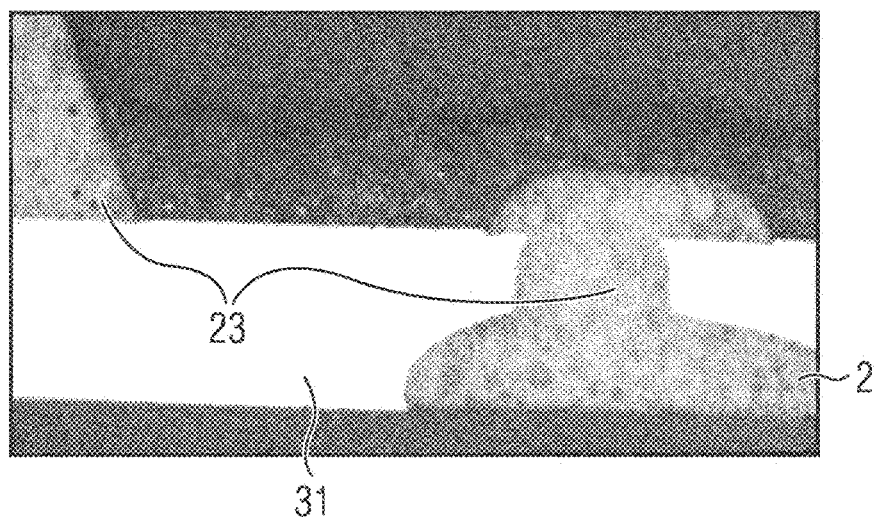
FIG. 1C: a microscope image in one embodiment.

FIG. 1C shows a microscope image of a side view of a component according to a working example. Here too, the large filler particles are apparent, whereas the smaller diffuser particles 22 are difficult to see or cannot be seen at all. The larger particles may have been broken up during the creation of the microscope image.

Figure 2A:
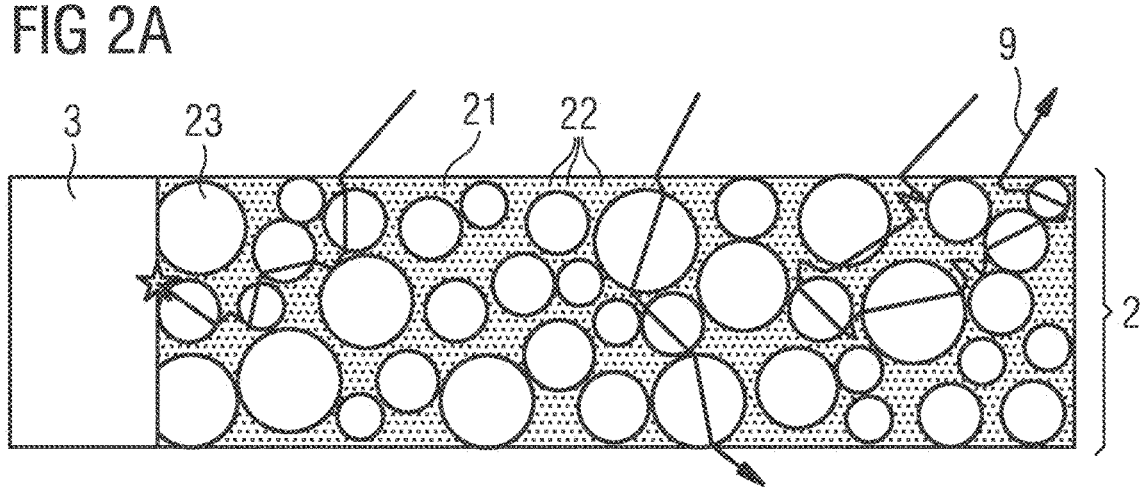
FIG. 2A: a schematic side view of an optoelectronic component in a comparative example.

FIG. 2A shows a schematic side view of a component in a working example. A reflection element 2 is shown here, having a matrix material 21 in which diffuser particles 22 are embedded. In addition, the component includes filler particles 23 embedded in the matrix material 21. The filler particles 23 have a matrix 231, but no scatter particles present in embedded or sintered form in this matrix 231. The matrix material may be in white form and the diffuser particles 22 or filler particles 23 may be clear. The reflection is effected by virtue of the high level of radiation-free scatter, which results from differences in refractive indices at the interfaces of highly refractive diffuser particles, for example titanium dioxide. The large filler particles 23, for example of silicon dioxide, have approximately the same refractive index as the matrix material, for example epoxy, and therefore barely distribute the radiation. The light thus passes through them.

The large filler particles 23, for example of silicon dioxide, therefore allow penetration of the light or radiation deeper into the material compared to if the filler particles 23 were filled with scatter particles 232. This has an adverse effect on the efficiency of the component because it increases the probability that the light will be trapped within the matrix material (EMC), lost, or absorbed by the carrier, especially the printed copper circuit board. Thus, in the component of the comparative example described here, there is predominantly absorption at the printed copper circuit board, transmission through the matrix material (EMC) and reflection owing to the long pathways.

Figure 2B:
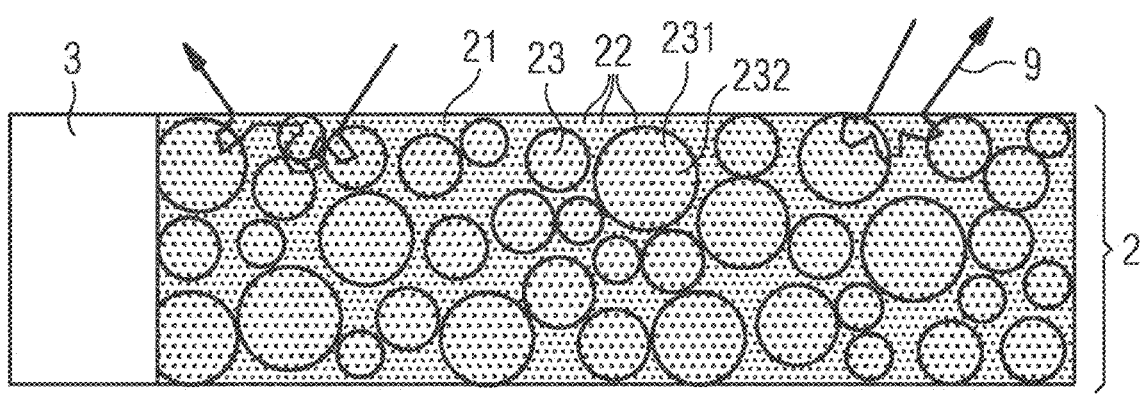
FIGS. 2B and 2C: a schematic side view in each case of a reflection element of an optoelectronic component in one embodiment.

By comparison, FIG. 2B shows a schematic side view of an optoelectronic component in one embodiment.

The filler particles 23 are filled here with further scatter particles 232, such that the penetration depth or penetration of the radiation can be greatly reduced and hence the probability of reflection rises. Moreover, shorter pathways in the material are generated, such that the light is emitted closer if it penetrates into the matrix material 21. It is thus possible to provide a well-defined reflector that may be partly in narrower form with a lower layer thickness. Moreover, it is then also possible to adjust the thickness of the printed circuit board. The reflector element and/or the printed circuit board may each or collectively have a thickness of 100 μm or 200 μm.

The reflector element 2 here thus has a matrix material 21 in which diffuser particles 22 and filler particles 23 are embedded. The filler particles 23 have a matrix 231, for example of glass. Scatter particles 232 may be embedded in this matrix 231. In a non-limiting embodiment, the scatter particles 232 are of the same materials as the diffuser particles 22. More particularly, the concentration of the diffuser particles 22 is the same as the concentration of the scatter particles 232 in the matrix 231.

Figure 2C:
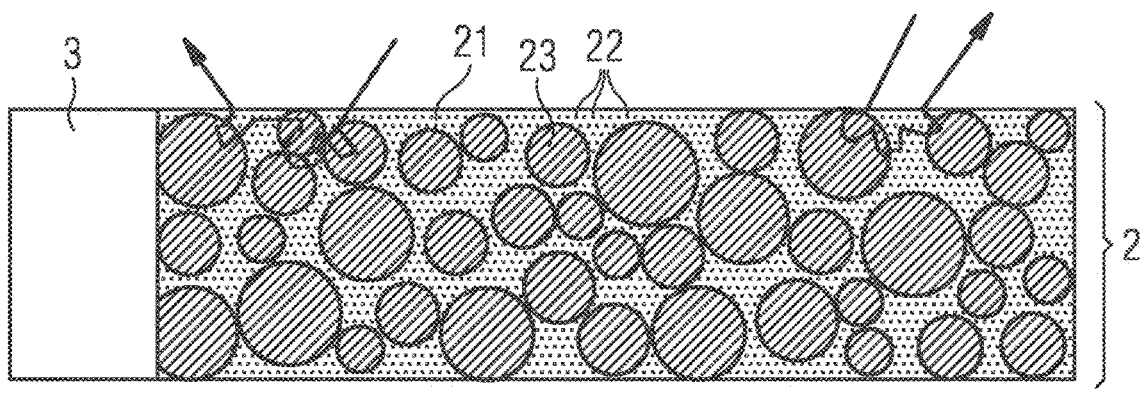

FIG. 2C shows a schematic side view of an optoelectronic component in one embodiment.

By comparison with the component of FIG. 2B, the reflection element here, especially the filler particles 23, is in ceramic form. In other words, for example, the scatter particles 232 in the ceramic have been sintered. For example, titanium dioxide and other materials, such as silicon oxide or magnesium fluoride, or else titanium dioxide only, are processed as a ceramic and then form the filler particles 23 after comminution.

The working examples described in association with the figures and features thereof may also be combined with one another in further working examples, even though such combinations are not shown explicitly in the figures. In addition, the working examples described in conjunction with the figures may have additional or alternative features according to the description in the general part.

The invention is not limited to the working examples by the description with reference thereto. Instead, the invention includes every new feature and every combination of features that includes the combination of features in the claims, even if this feature or this combination itself is not specified explicitly in the claims or working examples.

This patent application claims the priority of German patent application 10 2017 117 536.9, the disclosure content of which is hereby incorporated by reference.

LIST OF REFERENCE SYMBOLS

100 optoelectronic component
1 semiconductor chip
2 reflection element
21 matrix material
22 diffuser particles
23 filler particles
231 matrix
232 scatter particles
234 ceramic
d penetration depth
3 carrier
31 printed circuit board
4 housing
5 recess
6 conversion element
7 electrical contact connection, especially bonding wire
8 encapsulation
9 radiation

The invention claimed is:

1. An optoelectronic component comprising:
a semiconductor chip configured to emit radiation;
a housing comprising sidewalls with a recess between the sidewalls; wherein the semiconductor chip is arranged in the recess; and wherein the sidewalls comprise a reflection element configured to reflect radiation emitted from the semiconductor chip;
wherein the reflection element has a matrix material with diffuser particles and filler particles embedded therein,
wherein the diffuser particles are different from the filler particles;
wherein the filler particles comprise a matrix having scatter particles embedded therein;
wherein the diffuser particles consist of titanium dioxide,
wherein the matrix material is an epoxy molding compound,
wherein the filler particles comprise a silicate glass as the matrix having titanium dioxide scatter particles embedded therein, wherein an amount of the titanium dioxide scatter particles in the matrix ranges from 45 wt % to 70 wt % in relation to the total matrix material,
wherein an amount of the diffuser particles in the reflection element ranges from 45 wt % to 70 wt % in relation to the total matrix material,
wherein the average particle diameter of the diffuser particles is less than the average particle diameter of the filler particles.

2. The optoelectronic component as claimed in claim 1, wherein the diffuser particles have the average particle diameter smaller by a factor of at least 10 as compared to the filler particles.

3. The optoelectronic component as claimed in claim 1, wherein the concentration of the scatter particles in the filler particles corresponds to the concentration of the diffuser particles in the material.

4. The optoelectronic component as claimed in claim 1, wherein an amount of the diffuser particles ranges from 10 wt % to 30 wt % in the reflection element.

5. The optoelectronic component as claimed in claim 1, wherein the filler particles have a particle diameter ranging from 25 μm to 50 μm.

6. The optoelectronic component as claimed in claim 1, wherein the reflection element serves to insulate a printed circuit board.

7. The optoelectronic component as claimed in claim 1, wherein the housing is in direct contact with a carrier.

8. A process for producing the optoelectronic component as claimed in claim 1, wherein the process comprises: providing the semiconductor chip configured to emit radiation; producing the reflection element by: providing the matrix material; embedding the diffuser particles and the filler particles into the matrix material, wherein the diffuser particles are different from the filler particles; wherein the filler particles comprise the silicate glass matrix having the scatter particles embedded therein; and disposing the reflection element in the beam path of the semiconductor chip.

* * * * *